(12) United States Patent
Kim et al.

(10) Patent No.: US 12,177,995 B2
(45) Date of Patent: Dec. 24, 2024

(54) REMOTE CONTROLLER WITH WATERPROOF FUNCTION

(71) Applicant: KYUNG IN ELECTRONICS CO., LTD, Seoul (KR)

(72) Inventors: Bum Seok Kim, Anyang-si (KR); Jung Il An, Seoul (KR)

(73) Assignee: KYUNG IN ELECTRONICS CO., LTD, Seoul (KR)

( * ) Notice: Subject to any disclaimer, the term of this patent is extended or adjusted under 35 U.S.C. 154(b) by 203 days.

(21) Appl. No.: 18/066,937

(22) Filed: Dec. 15, 2022

(65) Prior Publication Data

US 2023/0199985 A1 Jun. 22, 2023

(30) Foreign Application Priority Data

Dec. 22, 2021 (KR) ........................ 10-2021-0184490

(51) Int. Cl.
*H05K 5/02* (2006.01)
*H05K 5/00* (2006.01)
*H05K 7/14* (2006.01)

(52) U.S. Cl.
CPC .......... *H05K 5/0217* (2013.01); *H05K 5/0004* (2013.01); *H05K 5/0017* (2013.01); *H05K 7/1427* (2013.01)

(58) Field of Classification Search
CPC ...................................... H05K 7/14
See application file for complete search history.

(56) References Cited

U.S. PATENT DOCUMENTS

| | | | |
|---|---|---|---|
| 8,654,081 B2 * | 2/2014 | Jung | H01H 13/83 345/169 |
| 2013/0118878 A1 * | 5/2013 | Purcocks | H01H 9/04 29/622 |

FOREIGN PATENT DOCUMENTS

| | | |
|---|---|---|
| JP | 2010-193519 A | 9/2010 |
| JP | 5760595 B2 | 8/2015 |
| KR | 10-0620721 B1 | 9/2006 |
| KR | 20-0430995 Y1 | 11/2006 |
| KR | 10-0968890 B1 | 7/2010 |
| KR | 10-1599762 B1 | 3/2016 |
| KR | 10-2021-0126423 A | 10/2021 |

OTHER PUBLICATIONS

Office Action for KR 10-2021-0184490 by Korean Intellectual Property Office dated May 22, 2023.

* cited by examiner

*Primary Examiner* — Jerry Wu
(74) *Attorney, Agent, or Firm* — BROADVIEW IP LAW, PC

(57) ABSTRACT

A remote control with a waterproof function includes a case including an upper case having button holes and a lower case assembled to the upper case at a lower portion of the upper case, a printed circuit board PCB embedded between the both cases, and a rubber keypad embedded in the case so as to be positioned between the upper case and the PCB and having buttons passing through the button holes. Barriers protruding upward or downward along the edges of the rubber keypad are provided, and when the both cases are coupled with the rubber keypad interposed therebetween, the side portions of the lower case and the lower ends of the barriers are in close contact with each other and the inner surface of the upper case and the upper ends of the barriers are in close contact with each other, thereby providing waterproof function.

9 Claims, 7 Drawing Sheets

REMOTE CONTROLLER WITH WATERPROOF FUNCTION

CROSS-REFERENCE TO RELATED APPLICATION

This application claims priority under 35 U.S.C § 119 to Korean Patent Application No. 10-2021-0184490 filed in the Korean Intellectual Property Office on Dec. 22, 2021, the entire contents of which are hereby incorporated by reference.

TECHNICAL FIELD

The present invention relates to a remote control with a waterproof function and, more particularly, to a remote control with a waterproof function, in which a waterproof structure is applied to each gap of a case so as to prevent water or moisture from penetrating into the case, thereby enhancing durability.

BACKGROUND ART

In general, a remote control capable of remotely controlling operations of a home appliance is used to promote consumer convenience.

However, as the frequency of using electronic products in humid or wet places such as bathrooms, hot springs, swimming pools, etc. increases recently, the demand for remote controls having a waterproof function is increasing.

A conventional remote control typically includes a case having an upper case and a lower case that are interlocked and combined, a keypad built into the case in a state where buttons are exposed through the through holes of the upper case, a printed circuit board PCB, which detects a button press signal and transmits an operation signal accordingly, and a battery built into the case so as to supply power.

However, in such a conventional remote control, water or moisture may penetrate through the gap between the upper case and the lower case, the gap between the buttons and the through holes of the upper case, and the gap between a cover that covers the battery and the lower case.

In this case, since the PCB or various electronic components built in the case are very vulnerable to water, the remote control may malfunction, thereby causing inconvenience to a user and trouble for repair or replacement.

In order to solve the problems, a remote control having a waterproof function has been developed in the past, but even in this case, it is not possible to ensure waterproofing for all gaps in the remote control and to secure sufficient durability. Therefore, there is a risk of failure and damage due to penetration of liquid such as water. Accordingly, there is a need to develop a remote control having a new configuration that can implement an excellent waterproof function over the entire area of the remote control and has excellent durability.

As related prior art, there is Korean Patent Registration No. 10-620721 (Title of Invention: remote control) and the like.

SUMMARY

Technical Problem

According to an embodiment of the present invention, a waterproof structure is applied to each gap of a case so as to prevent water or moisture from penetrating into the case, thereby enhancing durability.

The problems to be solved by the present invention are not limited to the problems mentioned above, and other problems not mentioned will be clearly understood by those skilled in the art from the following description.

Problem Solving Means

According to an embodiment of the present invention, a remote control with a waterproof function, may include a case including an upper case having a plurality of button holes and a lower case assembled to the upper case at a lower portion of the upper case, a printed circuit board PCB embedded between the upper case and the lower case, and a rubber keypad embedded in the case so as to be positioned between the upper case and the PCB and having a plurality of buttons passing through the plurality of button holes, wherein barriers protruding upward or downward along the edges of the rubber keypad may be provided, so that when the upper case and the lower case are coupled with the rubber keypad interposed between the upper case and the lower case, the side portions of the lower case and the lower ends of the barriers can come into close contact with each other and the inner surface of the upper case and the upper ends of the barriers can come into close contact with each other, thereby providing waterproof function.

According to an aspect of the present invention, the inner surface of the upper case may be formed with protruding walls for covering the outer surfaces of the barriers, and when the rubber keypad is coupled to the upper case, the barriers can come into close contact with the inner surface of the upper case and the outer surfaces of the barriers and the inner surfaces of the protruding walls can come into contact with each other.

According to another aspect of the present invention, the edge side portions of the upper case and the edge side portions of the lower case can be fitted and coupled to each other, and portions between the edge side portions and the protruding walls of the upper case and the inner portions of the edge side portions of the lower case can be coupled by means of screws.

According to another aspect of the present invention, each of the plurality of button holes of the upper case may include a protruding rib that protrudes inward from the upper case, and when the rubber keypad is coupled to the upper case, the lower end of the protruding rib can come into close contact with the upper surface of the rubber keypad that is provided with the buttons.

According to another aspect of the present invention, one of the button holes formed through the upper case may be a microphone hole, a protruding rib for surrounding the microphone hole may be provided on the inner surface of the upper case where the microphone hole is formed, the upper surface of the rubber keypad may be provided with a protruding rubber, which has a shape corresponding to that of a groove formed by the protruding rib and which has a communication hole corresponding to the microphone hole, and the lower surface of the rubber keypad on which the protruding rubber is formed may be provided with a microphone insertion groove, into which a rubber microphone attached by means of double-sided tape is inserted.

According to another aspect of the present invention, a buzzer hole may be formed through the lower case, a buzzer groove may be provided on the inner surface of the lower case where the buzzer hole is formed, a double-sided tape having a shape corresponding to that of the buzzer groove may be inserted into and attached to the buzzer groove, and at least one buzzer tape may be attached to the inner surface of the lower case by means of the double-sided tape.

According to another aspect of the present invention, a battery part may be further provided so that a battery is detachably coupled to a battery groove provided in the lower case, wherein the battery part may include a battery cover member for covering the battery groove in which the battery is mounted, and the battery cover member may be provided with a rubber member for pressing a wall that surrounds the battery groove.

According to another aspect of the present invention, the rubber member may be attached to the inner surface of the battery cover member by means of a double-sided tape, and a close contact protrusion may be provided on a surface of the rubber member that faces the battery groove and protrudes in the form of a strip so as to come into close contact with the wall that surrounds the battery groove.

According to another aspect of the present invention, the surface of the rubber member that faces the battery groove may be provided with a curved surface corresponding to the curved shape of the battery.

According to another aspect of the present invention, a window insertion groove for insertion and coupling of an infrared window may be provided on the front side of the case, and the inner surface of the window insertion groove may be formed of a horizontal plane by the protruding wall of the upper case which covers the barrier of the rubber keypad from the front and an extension wall which extends upward from the lower case.

According to another aspect of the present invention, when the infrared window is coupled to the window insertion groove, at least a portion of the inner surface of the infrared window which faces the window insertion groove may come into close contact with the window insertion groove.

Effect of the Invention

According to an embodiment of the present invention, a waterproof structure is applied to each gap of the case so as to prevent water or moisture from penetrating into the case, thereby enhancing durability.

In particular, by providing the waterproof function between the upper case and the lower case, between the buttons and the button holes, to the microphone hole and the buzzer hole, between the battery cover member and the case, or to the front end of the case where the infrared window is provided, it is possible to prevent failure due to penetration of water, etc.

DETAILED DESCRIPTION

Advantages and/or features of the present invention and methods of achieving them will become apparent with reference to the detailed description of the following embodiment taken in conjunction with the accompanying drawings. However, the present invention is not limited to the embodiment disclosed below and will be implemented in various different forms, the embodiment is provided only to make the disclosure of the present invention complete and to completely inform those skilled in the art of the scope of the invention to which the present invention belongs, and the invention is only defined by the scope of the claims. Like reference numbers designate like elements throughout the specification.

Hereinafter, an embodiment of the present invention will be described in detail with reference to the accompanying drawings.

Figure 1:
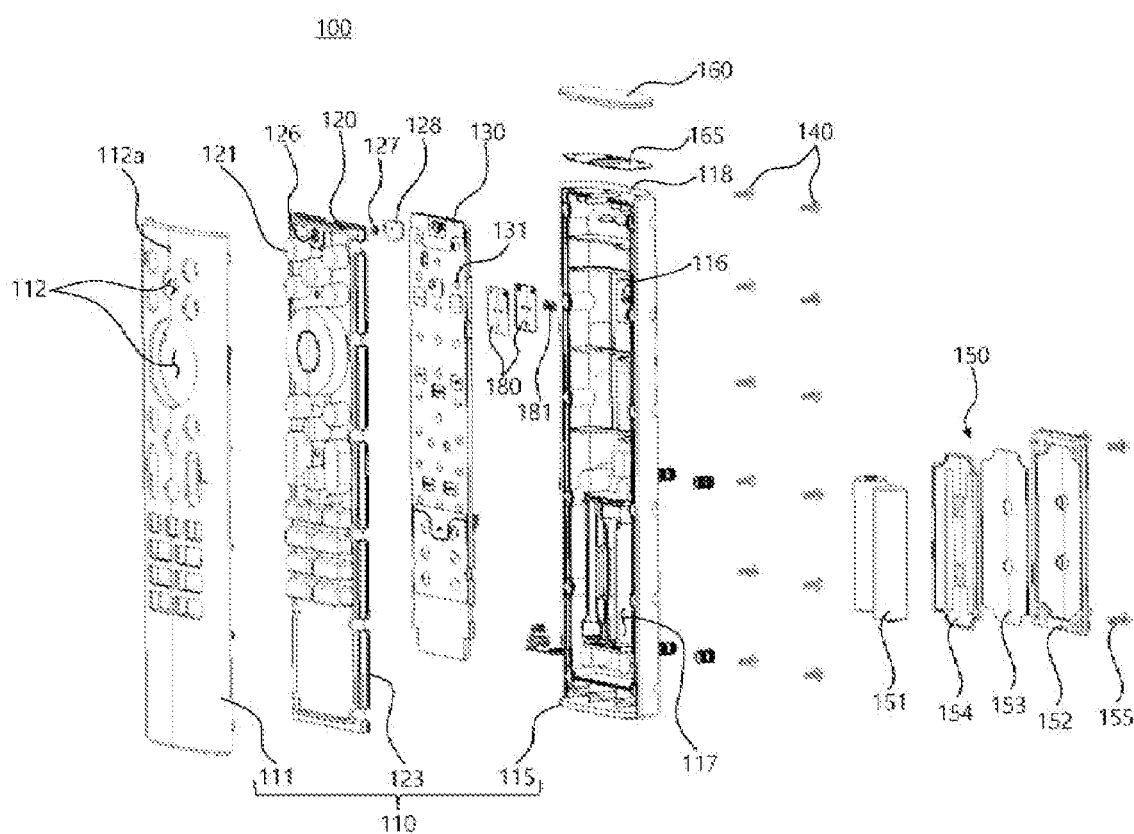
FIG. 1 is an exploded perspective view of a remote control with a waterproof function according to an embodiment of the present invention.
Figure 2:
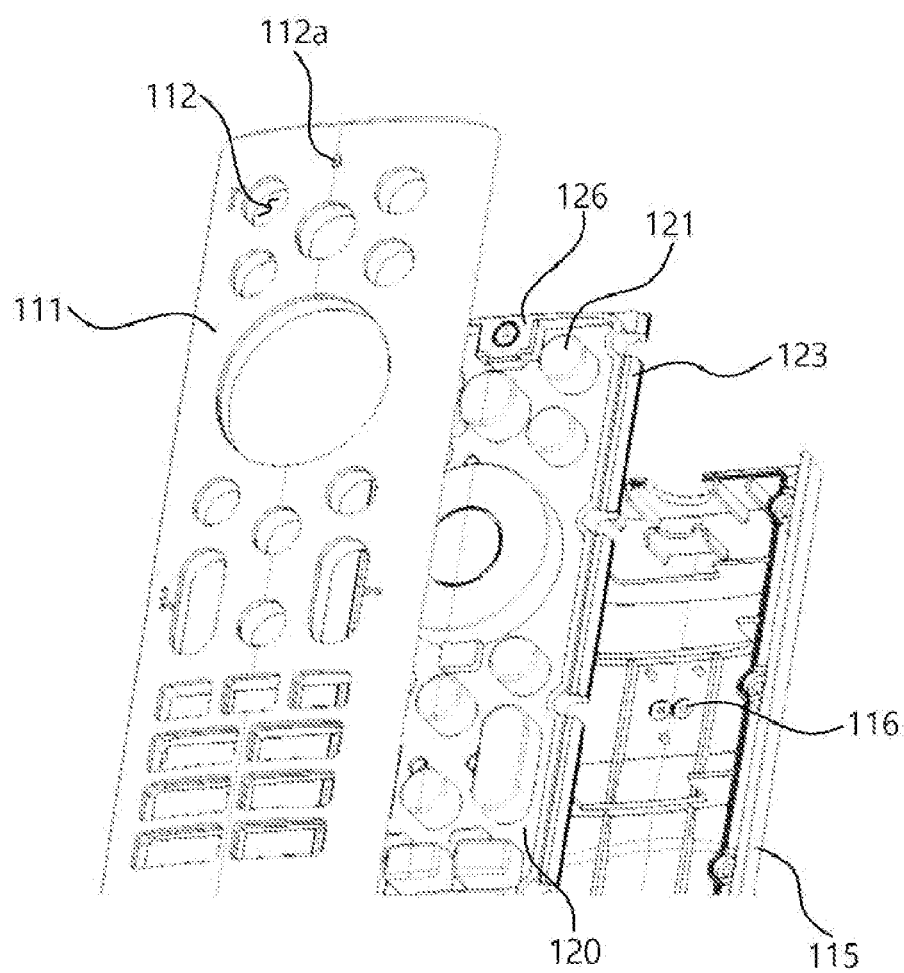
FIG. 2 is a partially exploded perspective view of the remote control shown in FIG. 1 in order to explain a waterproof structure between a case and a rubber keypad.
Figure 3:
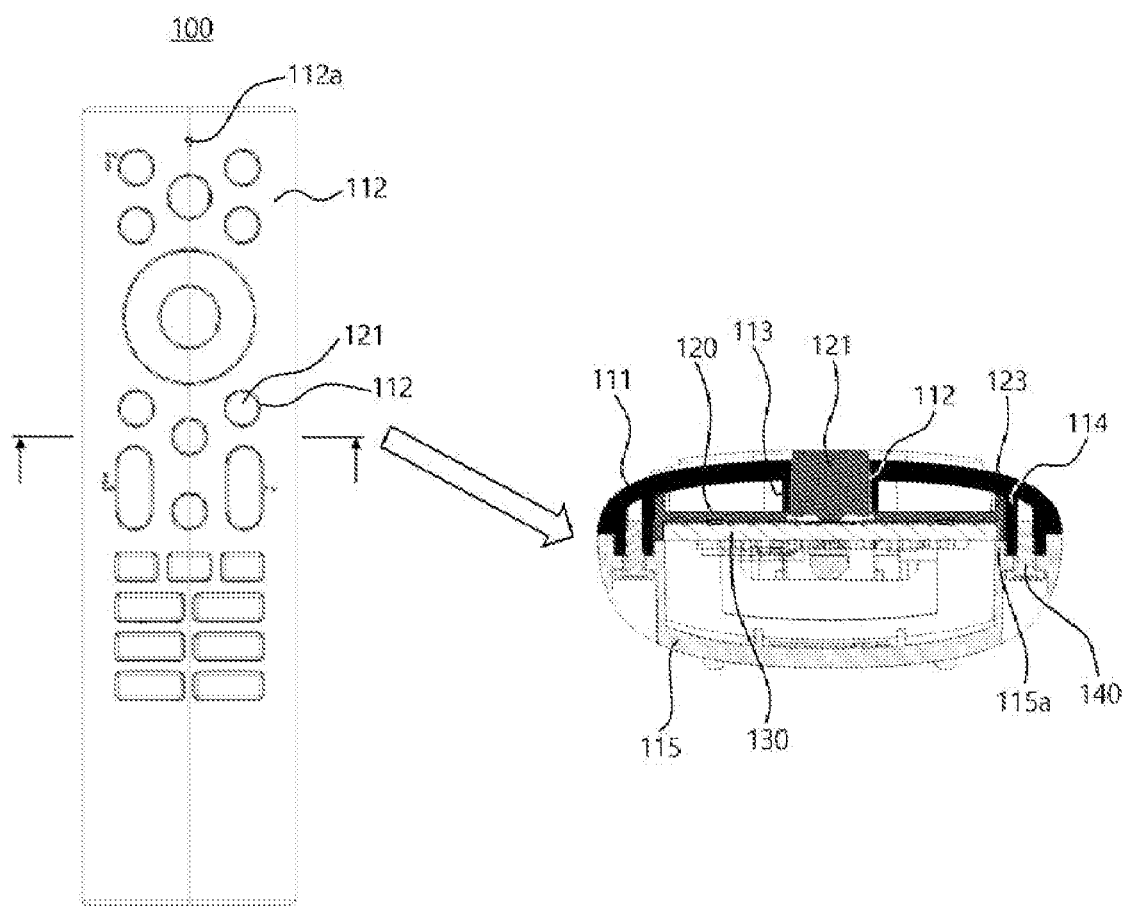
FIG. 3 shows a front view and a vertical cross-sectional view of the remote control shown in FIG. 1.
Figure 4:
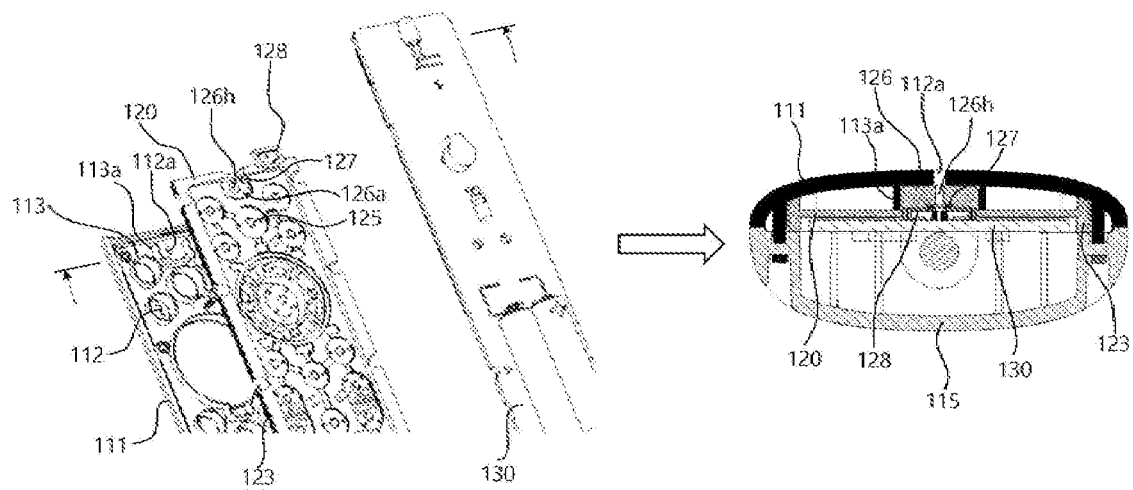
FIG. 4 shows views for explaining a waterproof structure for a microphone part in the remote control shown in FIG. 1.
Figure 5:
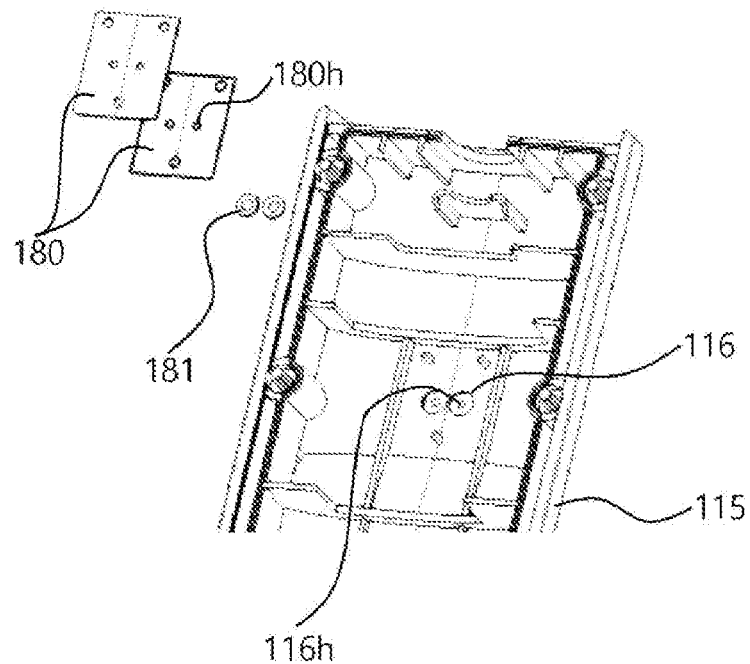
FIG. 5 is a view for explaining a waterproof structure for a buzzer part in the remote control shown in FIG. 1.
Figure 6:
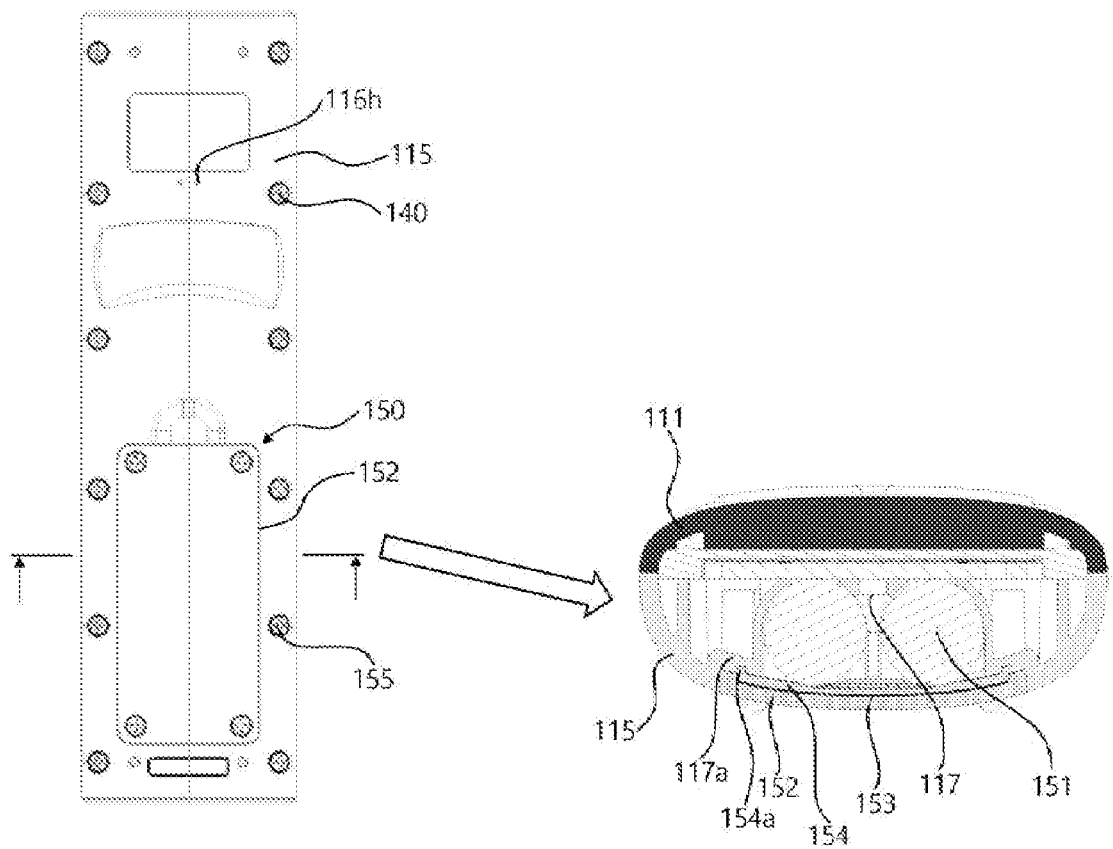
FIG. 6 shows a rear view and a vertical cross-sectional view of the remote control shown in FIG. 1.
Figure 7:
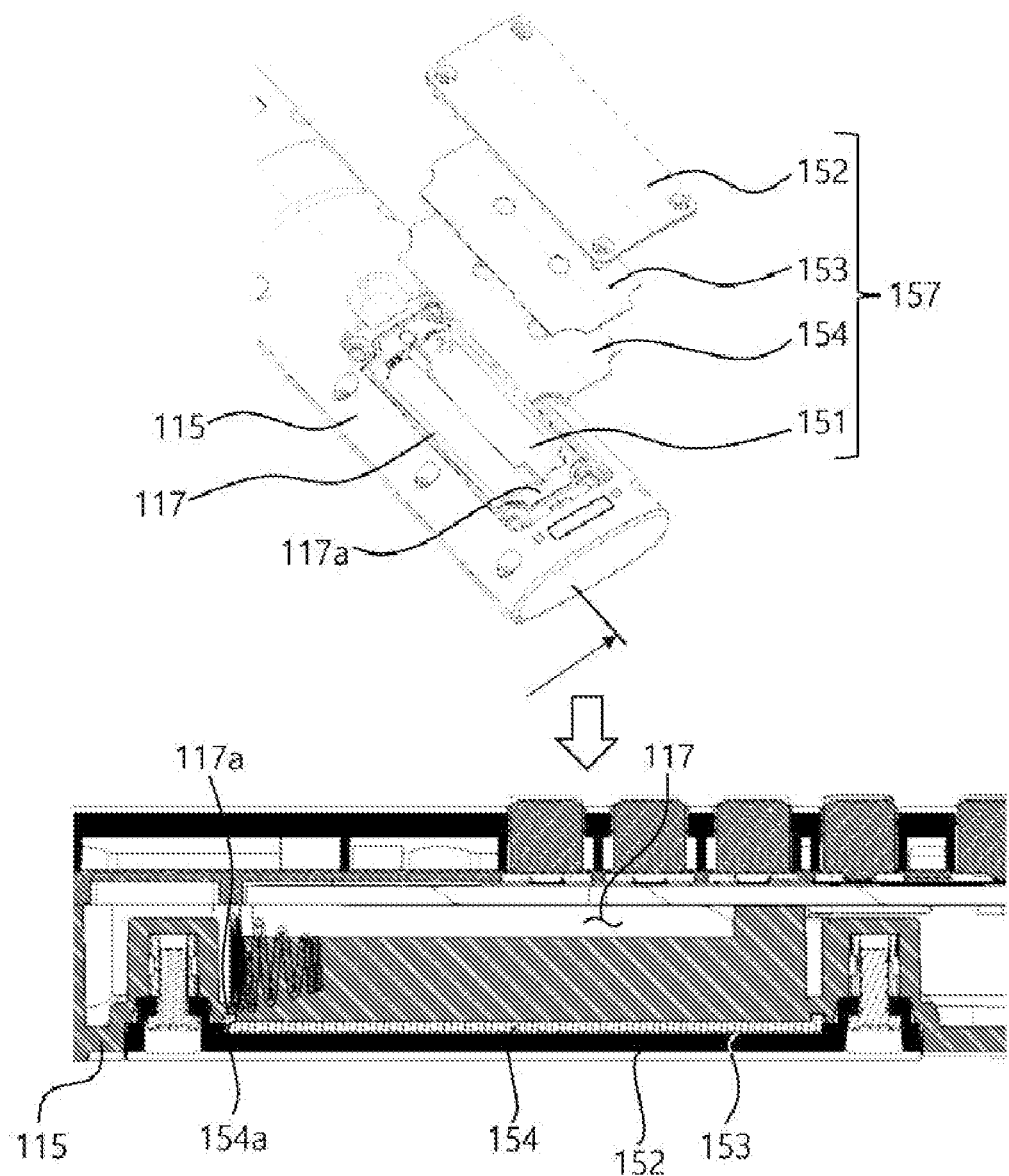
FIG. 7 shows views for explaining a battery structure in the remote control shown in FIG. 1 and its waterproof structure.
Figure 8:
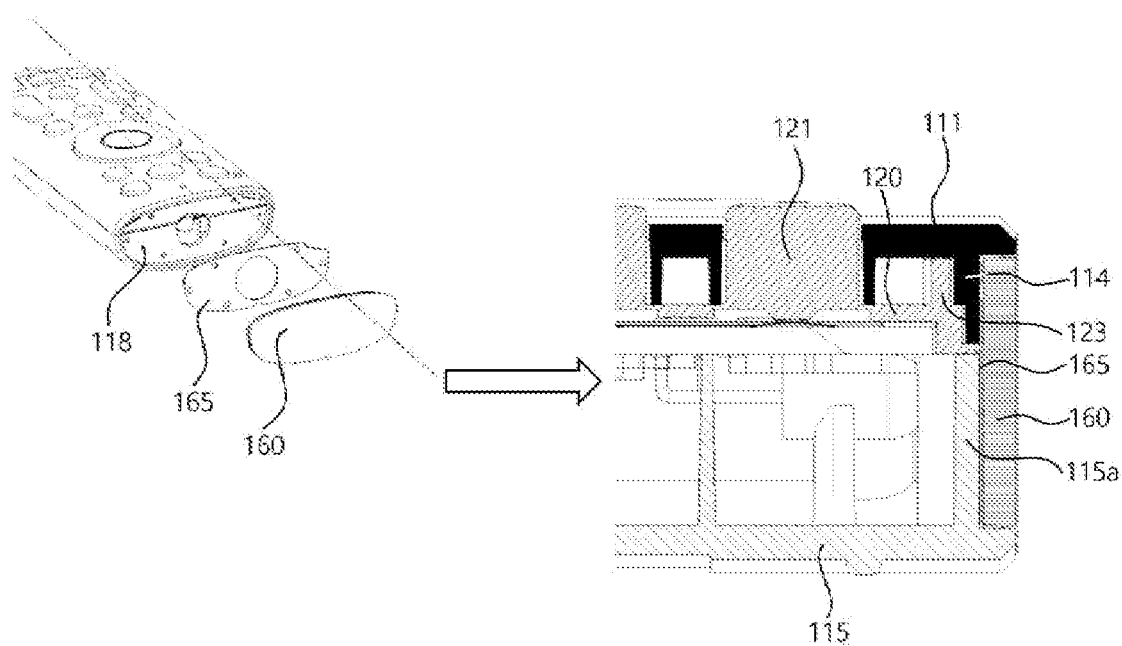
FIG. 8 shows views for explaining a waterproof structure for an infrared window in the remote control shown in FIG. 1.

FIG. 1 is an exploded perspective view of a remote control with a waterproof function according to an embodiment of the present invention, FIG. 2 is a partially exploded perspective view of the remote control shown in FIG. 1 in order to explain a waterproof structure between a case and a rubber keypad, FIG. 3 shows a front view and a vertical cross-sectional view of the remote control shown in FIG. 1, FIG. 4 shows views for explaining a waterproof structure for a microphone part in the remote control shown in FIG. 1, FIG. 5 is a view for explaining a waterproof structure for a buzzer part in the remote control shown in FIG. 1, FIG. 6 shows a rear view and a vertical cross-sectional view of the remote control shown in FIG. 1, FIG. 7 shows views for explaining a battery structure in the remote control shown in FIG. 1 and its waterproof structure, and FIG. 8 shows views for explaining a waterproof structure for an infrared window in the remote control shown in FIG. 1.

As shown in the drawings, a remote control 100 with a waterproof function (hereinafter, referred to as "remote control") according to an embodiment of the present invention, may include a case 110 having an upper case 111 and a lower case 115, a PCB 130 embedded in the case 110, a rubber keypad 120, which is positioned on the PCB 130 in the case 110 and has a plurality of buttons 121 exposed through button holes 112 of the case 110, a battery part 150 detachably coupled to a battery groove 117 of the case 110 while provided with a battery 151.

With this configuration, the remote control 100 of this embodiment has an excellent waterproof function through the coupling of each component while firmly implementing the coupling of each component, so that, for example, water or moisture cannot penetrate into the remote control 100 and excellent durability can be provided.

When explaining each component, the case 110 of the present embodiment may include, as shown in FIG. 1 and FIG. 2, the upper case 111 having the plurality of button holes 112 and the lower case 115 assembled to the upper case 111 below the upper case 111.

The upper case 111 of this embodiment is provided with the plurality of button holes 112 through which the buttons 121 of the rubber keypad 120, which will be described later, are disposed through. As will be described later, since a waterproof structure is applied to the gap between the button holes 112 and the buttons 121, it is possible to prevent water or moisture from entering the inside of the case 110.

The lower case 115 of this embodiment is provided with the battery groove 117, so that the battery part 150 can be detachably mounted. In addition, an infrared window 160 is mounted on the front of the upper case 111 and the lower case 115, and all of the above-described coupling structures may have a waterproof function.

Meanwhile, the rubber keypad 120 of this embodiment includes, as shown in FIG. 1 to FIG. 4, the plurality of buttons 121, which are provided on the upper surface thereof so as to be inserted into and exposed through the button holes 112 of the upper case 111, and protrusion members 125, which are arranged on the lower surface so as to correspond to the buttons 121 respectively (see FIG. 4), so that when the buttons 121 are pressed, the pressing force may be transmitted to domes 131 of the PCB 130 by the protrusion members 125.

Therefore, when the user presses any of the buttons 121, the protrusion member 125 linked with the button 121 presses the corresponding dome 131 of the PCB 130, so that the signal generated thereby can be transmitted, for example, to an electronic product through the infrared window 160 to be described later.

The rubber keypad 120 may be made of a material such as rubber or silicone having elasticity and durability. Due to the material of the rubber keypad 120, side portions of the rubber keypad 120 can be tightly adhered to the upper case 111 and the lower case 115, thereby providing a waterproof function, which will be described in detail below.

Referring to FIG. 1 and FIG. 2, the PCB 130 is embedded between the upper case 111 and the lower case 115 of this embodiment, and the rubber keypad 120 made of rubber is embedded between the upper case 111 and the PCB 130, wherein as shown in FIG. 2, the side walls of the upper case 111, the rubber keypad 120 and the lower case 115 are provided with a waterproof structure so as to be pressurized and adhered to each other, so that water or moisture from the outside can be prevented from penetrating into the case 110.

As shown in FIG. 2 and FIG. 3, barriers 123 protruding upward or downward are provided along the edges of the rubber keypad 120 of this embodiment. Therefore, when the upper case 111 and the lower case 115 are coupled, portions 115a of the side portions of the lower case 115 and the lower ends of the barrier 123 of the rubber keypad 120 can come into close contact with each other and the inner surface of the upper case 111 and the upper ends of the barrier 123 can come into close contact with each other.

Therefore, for example, even if water or moisture penetrates between the lower case 115 and the upper case 111, the barriers 123 of the rubber keypad 120 can prevent the water or moisture from penetrating into the inside. That is, it is possible to prevent external materials from entering the internal button 121, the PCB 130 or the like.

Referring to FIG. 3, since the barriers 123 of the rubber keypad 120 have a structure surrounding the side portions of the PCB 130, it is possible to prevent water or the like from coming into contact with the PCB 130 in particular.

In addition, it is possible to enhance the waterproof function by providing a multi-layered wall structure instead of securing the waterproof function only by the barriers 123, wherein protruding walls 114 may protrude from the inner surface of the upper case 111 so as to cover the outer surfaces of the barriers 123 of the rubber keypad 120, as shown in FIG. 3.

Therefore, when the rubber keypad 120 is coupled to the upper case 111, the upper ends of the barriers 123 come into close contact with the inner surface of the upper case 111 by elastic force, and the outer surface of the barriers 123 and the inner surface of the protruding walls 114 come into contact with each other. That is, the protruding walls 114 cover the barriers 123, thereby enhancing the waterproof function.

In addition, the edge side portions of the upper case 111 and the lower case 115 of this embodiment are fitted and coupled to each other. As shown in the cross-sectional view of FIG. 3, portions between the edge side portions of the upper case 111 and the protruding walls 114 and the inner portions of the edge side portions of the lower case 115 may be coupled by screws 140.

In this way, since the coupling by means of the screws 140 of the upper case 111 and the lower case 115 is positioned outside the area where the waterproof structure is applied, through the screw coupling, the upper case 111 and the lower case 115 can be firmly coupled and weakening of the waterproof structure can also be prevented.

Meanwhile, in order to prevent water or moisture from penetrating between the buttons 121 and the button holes 112, a waterproof structure should be applied between the buttons 121 and the button holes 112 as well. For this purpose, as shown in FIG. 4, each of the plurality of button holes 112 of the upper case 111 may include a protruding rib that protrudes inward from the upper case 111.

As shown in the cross-sectional view of FIG. 3, when the rubber keypad 120 is coupled to the upper case 111, the lower ends of the protruding ribs 113 press the upper surface of the rubber keypad 120 adjacent to the buttons 121. At this time, as described above, the rubber keypad 120 is made of an elastic material, so the lower ends of the protruding ribs 113 and the upper surface of the rubber keypad 120 can come into close contact with each other tightly.

Therefore, even if a liquid such as water enters between the buttons 121 and the button holes 112, the protruding ribs 113 and the rubber keypad 120 are strongly adhered to each other and provide a waterproof function, so that the liquid cannot penetrate into the inside.

Meanwhile, referring to FIG. 3 and FIG. 4, in the remote control 100 of this embodiment, a waterproof function may be provided to a microphone hole 112a in which a microphone is installed. One of the button holes 112 formed through the front of the upper case 111 is a microphone hole 112a, which can be used as a passage for transmitting voice to the microphone mounted on the PCB 130.

As shown in FIG. 4, a protruding rib 113a may be formed protruding from the inner surface of the upper case 111, where the microphone hole 112a is formed, so as to surround the microphone hole, and a protruding rubber 126 may be provided on the upper surface of the rubber keypad 120, wherein the protruding rubber 126 is formed in a shape corresponding to the groove formed by the protruding rib 113a and has a communication hole 126h that is formed through the protruding rubber 126 so as to correspond to the microphone hole 112a.

In this way, since the protruding rib 113a of the microphone hole 112a and the protruding rubber 126 of the rubber keypad 120 correspond in shape, the protruding rubber 126 can be inserted into the protruding rib 113a of the microphone hole 112a, wherein a waterproof structure between the protruding rib 113a and the protruding rubber 126 can be implemented in such a manner that the upper surface of the rubber keypad 120 provided with the protruding rubber 126 is pressed by the protruding rib 113a.

In addition, a microphone insertion groove 126a is provided on the recessed lower surface of the rubber keypad 120 on which the protruding rubber 126 is formed, and a rubber microphone 128 can be attached to the microphone insertion groove 126a by a double-sided tape 127. Therefore, as shown in the cross-sectional view of FIG. 4, it is possible to prevent the penetration of water or moisture into the rubber microphone 128 through the microphone hole 112a.

Meanwhile, referring to FIG. 5, one pair of buzzer holes 116h are formed through the lower case 115, buzzer grooves 116 may be provided on the inner surface of the lower case 115 where the buzzer holes 116h are formed. That is, the buzzer holes 116h are formed in the buzzer grooves 116. Therefore, a waterproof structure should also be applied to the buzzer holes 116h. To this end, double-sided tapes 181 corresponding to the shape of the buzzer grooves 116 are inserted into and attached to the buzzer grooves 116, and for example, two-layered buzzer tapes 180 may be attached by the double-sided tape.

The buzzer tapes 180 has through holes 180h formed through the buzzer tapes 180 and corresponding to the buzzer holes 116h, and the double-sided tapes 181 are provided as a mesh tape, so that it is possible to maintain communication between the buzzer tapes 180 and the buzzer holes 116h and have a waterproof function due to the tape adhesive structure.

Meanwhile, referring to FIG. 6 and FIG. 7, the lower case 115 of this embodiment may include the battery part 150 to which the battery 151 is detachably coupled.

This battery part 150 may include the battery groove 117 provided on the lower case 115 and a battery cover member 152 for covering the battery groove 117 in which the battery 151 is mounted, as shown in the cross-sectional view of FIG. 6 and the exploded perspective view in the upper portion of FIG. 7.

A waterproof structure should be applied to the battery structure as well. To this end, the battery cover member 152 of this embodiment may include a rubber member 154 for pressing a wall that surrounds the battery groove 117.

Referring to FIG. 6 and FIG. 7, the rubber member 154 may be attached to the inner surface of the battery cover member 152 by the double-sided tape 153. On one side of the rubber member 154 that face the battery groove 117, close contact protrusions 154a that come into close contact with side walls 117a that surround the battery groove 117 may protrude in a band shape.

Since the rubber member 154 can be made of, for example, a rubber material or a silicone material, and the close contact protrusions 154a are also provided to the rubber member 154 with the same material, when the battery cover member 152 is coupled to the battery groove 117 by means of a screw 155, the close contact protrusions 154a of the rubber member 154 strongly come into close contact with the side walls 117a of the battery groove 117, thereby implementing a waterproof structure of the battery part 150.

In addition, although not shown in detail, the surface of the rubber member 154 that faces the battery groove 117 is provided with a curved surface corresponding to the curved shape of the battery 151. Therefore, when the battery groove 117 is covered with the battery cover member 152 after placing the battery 151 in the battery groove, the position of the battery 151 can be firmly maintained.

Meanwhile, referring to FIG. 8, the infrared window 160 may be coupled to the front surface of the case 110 of this embodiment. More specifically, the front side of the case 110 is formed with a window insertion groove 118 recessed inwardly, and the infrared window 160 can be inserted into and coupled to the window insertion groove 118.

Herein, the inner surface of the window insertion groove 118 can be made into a horizontal plane by the protruding walls 114 of the upper case 111 that cove the barriers 123 of the rubber keypad 120 from the front and the extension walls 115a that extend upward from the lower case 115. As described above, since the barriers 123 of the rubber keypad 120 has the structure in close contact with the upper case 111 and the lower case 115, the front end portion of the case 110 can also implement a waterproof structure.

In this way, according to the one embodiment of the present invention, by providing a waterproof structure in all gaps in the case 110, it is possible to prevent water or moisture from penetrating into the case 110, thereby enhancing durability.

In other words, by providing the waterproof function between the upper case 111 and the lower case 115, between the buttons 121 and the button holes 112, to the microphone hole 112a and the buzzer holes 116h, between the battery cover member 152 and the case 110, or to the front end portion of the case 110 where the infrared window 160 is provided, it is possible to prevent failure due to penetration of water or moisture, etc.

Although the specific embodiment according to the present invention have been described so far, various modifications can be made thereto without departing from the scope of the present invention. Therefore, the scope of the present invention should not be limited to the described embodiment and should not be defined, but should be defined by not only the scope of the claims to be described later but also those equivalents to the scope of these claims.

As described above, the present invention has been described by the limited embodiment and drawings, but the present invention is not limited to the above embodiment, and those skilled in the art in the field to which the present invention belongs can make various modifications and changes. Therefore, the spirit of the present invention should be grasped only by the claims described below, and all equivalent or equivalent modifications thereof will be said to belong to the scope of the spirit of the present invention.

EXPLANATION OF REFERENCE NUMERALS

100: Remote control with a waterproof function
110: Case
111: Upper case
112: Button hole
112a: Microphone hole
113: Protruding rib
114: Protruding wall
115: Lower case
116: Buzzer groove
116h: Buzzer hole
117: Battery groove
118: Window insertion groove
120: Rubber keypad
121: Button
123: Barrier
126: Protruding rubber
127: Double-sided tape
128: Rubber microphone
130: PCB
131: Dome
150: Battery part
151: Battery 152: Battery cover member
153: Double-sided tape
154: Rubber member
154a: Close contact protrusion
160: Infrared window
165: Double-sided tape
180: Buzzer tape
181: Double-sided tape

What is claimed is:

1. A remote control with a waterproof function, comprising: a case including an upper case having a plurality of button holes and a lower case assembled to the upper case at a lower portion of the upper case; a printed circuit board PCB embedded between the upper case and the lower case; and a rubber keypad embedded in the case so as to be positioned between the upper case and the PCB and having a plurality of buttons passing through the plurality of button holes, wherein barriers having upper ends and lower ends protruding upward and downward along the edges of the rubber keypad are provided respectively, and when the upper case and the lower case are coupled with the rubber keypad interposed between the upper case and the lower case, top surfaces of side portions of the lower case and the lower ends of the barriers are in close contact with each other and inner surface of the upper case facing to the barriers and outer surfaces of upper ends of the barriers are in close contact with each other, thereby providing waterproof function; and the inner surface of the upper case is formed with protruding walls for covering the outer surfaces of the barriers, and when the rubber keypad is coupled to the upper case, the barriers come into close contact with the inner surface of the upper case and the outer surfaces of the barriers and the inner surfaces of the protruding walls come into contact with each other; and the edge side portions of the upper case and the edge side portions of the lower case are fitted and coupled to each other, and portions between the edge side portions and the protruding walls of the upper case and the inner portions of the edge side portions of the lower case are coupled by means of screws.

2. The remote control with a waterproof function according to claim 1, wherein each of the plurality of button holes of the upper case includes a protruding rib that protrudes inward from the upper case, and when the rubber keypad is coupled to the upper case, the lower end of the protruding rib comes into close contact with the upper surface of the rubber keypad that is provided with the buttons.

3. The remote control with a waterproof function according to claim 1, wherein one of the button holes formed through the upper case is a microphone hole, a protruding rib for surrounding the microphone hole is provided on the inner surface of the upper case where the microphone hole is formed, the upper surface of the rubber keypad is provided with a protruding rubber, which has a shape corresponding to that of a groove formed by the protruding rib and which has a communication hole corresponding to the microphone hole, and the lower surface of the rubber keypad on which the protruding rubber is formed is provided with a microphone insertion groove, into which a rubber microphone attached by means of double-sided tape is inserted.

4. The remote control with a waterproof function according to claim 1, wherein a buzzer hole is formed through the lower case, a buzzer groove is provided on the inner surface of the lower case where the buzzer hole is formed, a double-sided tape having a shape corresponding to that of the buzzer groove is inserted into and attached to the buzzer groove, and at least one buzzer tape is attached to the inner surface of the lower case by means of the double-sided tape.

5. The remote control with a waterproof function according to claim 1, further comprising a battery part in which a battery is detachably coupled to a battery groove provided in the lower case, wherein the battery part includes a battery cover member for covering the battery groove in which the battery is mounted, and the battery cover member is provided with a rubber member for pressing a wall that surrounds the battery groove.

6. The remote control with a waterproof function according to claim 5, wherein the rubber member is attached to the inner surface of the battery cover member by means of a double-sided tape, and a close contact protrusion is provided on a surface of the rubber member that faces the battery groove and protrudes in the form of a strip so as to come into close contact with the wall that surrounds the battery groove.

7. The remote control with a waterproof function according to claim 5, wherein the surface of the rubber member that faces the battery groove is provided with a curved surface corresponding to the curved shape of the battery.

8. The remote control with a waterproof function according to claim 1, wherein a window insertion groove for insertion and coupling of an infrared window is provided on the front side of the case, and the inner surface of the window insertion groove is formed of a horizontal plane by the protruding wall of the upper case which covers the barrier of the rubber keypad from the front and an extension wall which extends upward from the lower case.

9. The remote control with a waterproof function according to claim 8, wherein when the infrared window is coupled to the window insertion groove, at least a portion of the inner surface of the infrared window which faces the window insertion groove comes into close contact with the window insertion groove.

\* \* \* \* \*